United States Patent [19]
Kaneko

[11] Patent Number: 5,969,577
[45] Date of Patent: Oct. 19, 1999

[54] VOLTAGE CONTROLLED OSCILLATOR LESS SENSITIVE TO FLUCTUATION OF THRESHOLD OF COMPONENT TRANSISTORS

[75] Inventor: Makoto Kaneko, Tokyo, Japan

[73] Assignee: NEC Corporation, Tokyo, Japan

[21] Appl. No.: 09/071,195

[22] Filed: May 4, 1998

[30] Foreign Application Priority Data

May 2, 1997 [JP] Japan ................................. 9-130414

[51] Int. Cl.[6] ............................. H03B 5/04; H03B 5/24
[52] U.S. Cl. ..................... 331/57; 331/175; 331/177 R; 331/186; 327/281
[58] Field of Search .............................. 331/34, 57, 175, 331/176, 177 R, 185, 186; 327/280, 281

[56] References Cited

U.S. PATENT DOCUMENTS

| | | | |
|---|---|---|---|
| 5,426,398 | 6/1995 | Kuo | 331/57 |
| 5,446,417 | 8/1995 | Korhonen et al. | 331/57 |
| 5,469,120 | 11/1995 | Nguyen et al. | 331/177 R |
| 5,475,344 | 12/1995 | Maneatis et al. | 331/57 |
| 5,495,207 | 2/1996 | Novof | 331/57 |
| 5,563,553 | 10/1996 | Jackson | 331/57 |

OTHER PUBLICATIONS

Toshiyuki Okuyama et al., "Design of a 3GHz GaAs PLL–Based Clock Pulse Generator", *Technical Report of IEICE*, ED93–152, MT93–109, ICD93–167, Jan. 1994, pp. 31–38.

*Primary Examiner*—David Mis
*Attorney, Agent, or Firm*—Sughrue, Mion, Zinn, Macpeak & Seas, PLLC

[57] ABSTRACT

A voltage controlled oscillator is implemented by odd inverters forming a loop, and a depletion type load transistor, a depletion type frequency control transistor and a depletion type compensating transistor supply driving current to an enhancement type driving transistor in each inverter; the compensating transistor is controlled by a reference voltage generator implemented by a series of resistor and a depletion type load transistor, and fluctuation in a fabrication process equally affects the depletion type transistors; when the depletion transistors increases the driving current, the resistor decreases the reference voltage supplied to the gate electrode of the depletion type compensating transistor, and the depletion type compensating transistor cancels the increment of the driving current so as to make the voltage controlled oscillator less sensitive to the fluctuation of the threshold.

8 Claims, 5 Drawing Sheets

VOLTAGE CONTROLLED OSCILLATOR LESS SENSITIVE TO FLUCTUATION OF THRESHOLD OF COMPONENT TRANSISTORS

FIELD OF THE INVENTION

This invention relates to a voltage controlled oscillator and, more particularly, to a voltage controlled oscillator appropriate for a phase locked loop.

DESCRIPTION OF THE RELATED ART

A typical example of the voltage controlled oscillator is disclosed by Okuyama et. al. in "3GHz GaAs PLL-based Clock Pulse Oscillator", Technical Report of Institute of Electronics Information and Communication Engineers, ED93-152, MT93-109, ICD93-167, 1994-1, pages 31 to 38. FIG. 1 illustrates the prior art voltage controlled oscillator incorporated in the phase locked loop. The prior art voltage controlled oscillator is a ring oscillator, and the ring oscillator is implemented by inverters 1, 2 and 3. The inverters 1, 2 and 3 are connected in cascade, and the ring oscillator requires odd stages. The output nodes N1, N2 and N3 of the inverters 1, 2 and 3 are connected to the input nodes N4, N5 and N6 of the inverters 2, 3 and 1, respectively. The inverters 1, 2 and 3 are similar in circuit arrangement to one another, and each inverter 1, 2 or 3 includes a series combination of a depletion type field effect transistor DFET1 and an enhancement type field effect transistor EFET1 connected between a source Vp of power voltage level and a ground line GND, and the output node N1/N2/N3 is between the depletion type field effect transistor DFET1 and the enhancement type field effect transistor EFET1. The gate electrode of the depletion type field effect transistor DFET1 is connected to the source node thereof or the output node N1/N2/N3, and the gate electrode of the enhancement type field effect transistor EFET1 serves as the input node N6/N4/N5. The inverter 1/2/3 further includes a depletion type field effect transistor DFET2 connected between the source of power voltage Vp and the source node of the depletion type field effect transistor DFET1, and a control voltage signal CV1 is supplied to the gate electrode of the depletion type field effect transistor DFET2.

The depletion type field effect transistor DFET1 and the enhancement type field effect transistor EFET1 serve as a load and a driver, respectively, and the depletion type field effect transistor DFET2 controls driving current flowing through the inverter 1/2/3. When the driving current is changed, the ring oscillator varies the oscillation frequency. In detail, the driving current is the sum of constant current passing through the depletion type field effect transistor DFET1 and variable current passing through the depletion type field effect transistor DFET2. Propagation delay is dependent on the sum, and the ring oscillator varies the oscillation frequency. For example, when the control voltage signal CV is decreased, the depletion type field effect transistor DFET2 decreases the amount of variable current so as to weaken the pull-up, and each inverter 1/2/3 increases the propagation delay. As a result, the ring oscillator decreases the oscillation frequency. On the other hand, when the control voltage signal CV is increased, the depletion type field effect transistor DFET2 increases the variable current, and makes the pull-up strong. Each inverter 1/2/3 decreases the propagation delay, and the ring oscillator increases the oscillation frequency.

FIG. 2 illustrates a simulation representative of the relation between the threshold of the depletion type field effect transistor and the oscillation frequency. In the simulation, the ring oscillator is assumed to have nine inverters connected in cascade, and the depiction type field effect transistors DFET1/ DFET2 are assumed to be powered with 2.0 volts. The control voltage signal CV1 is changed from 0.1 volt to 0.8 volt. If the voltage controlled oscillator is expected to oscillate at 1 GHz, the threshold of the depletion type field effect transistors is expected to range between −0.70 volt to −0.30 volt, and the allowed range is only 0.40 volt. As shown in FIG. 1, the gate electrode of the depletion type field effect transistor DFET1 is connected to the source node thereof, and the gate-to-source voltage Vgs is zero. In this situation, if the fabrication process fluctuates, the threshold of the depletion type field effect transistors is undesirably out of the allowed range, and the ring oscillator becomes defective.

When the prior art voltage controlled oscillator is installed in a phase locked loop, the prior art voltage controlled oscillator is expected to oscillate at a certain frequency under a predetermined design control voltage CV1. However, the prior art voltage controlled oscillator is strongly influenceable by the threshold of the depletion type field effect transistor, and the threshold is sensitive to the fluctuation of the fabrication process. Thus, the prior art voltage controlled oscillator is not appropriate to the phase locked loop.

SUMMARY OF THE INVENTION

It is therefore an important object of the present invention to provide a voltage controlled oscillator, the oscillation frequency of which is less influenceable by the threshold of a component transistor.

To accomplish the object, the present invention proposes to compensate the variation of driving current due to fluctuation of process parameters.

In accordance with one aspect of the present invention, there is provided a voltage controlled oscillator comprising odd logic gates forming a signal propagation loop, each of the odd logic gates including an input node, an output node connected to the input node of the next logic gate in the signal propagation loop, a driving transistor responsive to an input potential level at the input node for producing an output potential level opposite to the input potential levels and introducing a piece of time delay variable in dependence on the amount of driving current supplied to, a load transistor connected to the driving transistor for constantly supplying a first part of the driving current, a control transistor connected to the driving transistor and responsive to a control voltage signal for supplying a second part of the driving current variable together with the magnitude of the voltage control signal and a compensating transistor connected to the driving transistor and responsive to a reference voltage signal for supplying a third part of the driving current compensating a difference between the total of the first part and the second part and a design value, and a reference voltage generator producing the reference voltage signal and varying the magnitude of the reference voltage signal inversely to the current driving capability of the load transistor and the current driving capability of the control transistor.

BRIEF DESCRIPTION OF THE DRAWINGS

The features and advantages of the voltage controlled oscillator will be more clearly understood from the following description taken in conjunction with the accompanying drawings in which.

DESCRIPTION OF THE PREFERRED EMBODIMENTS

First Embodiment

Figure 1:
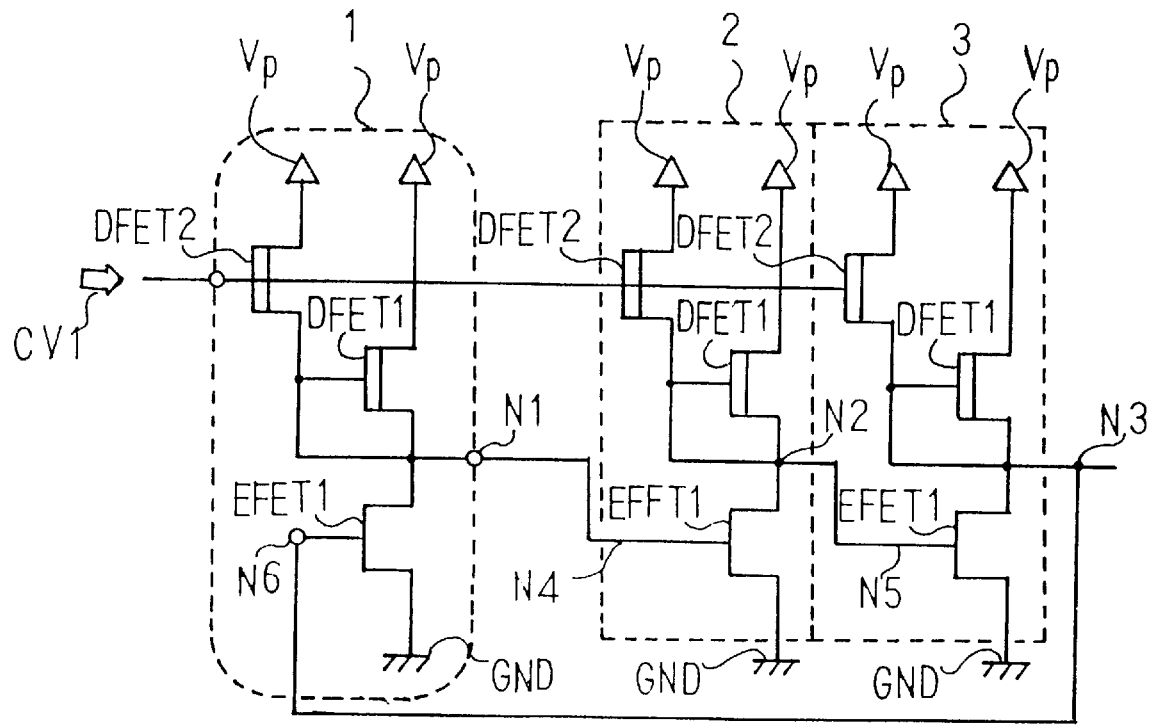
FIG. 1 is a circuit diagram showing the circuit configuration of the prior art voltage controlled oscillator.
Figure 2:
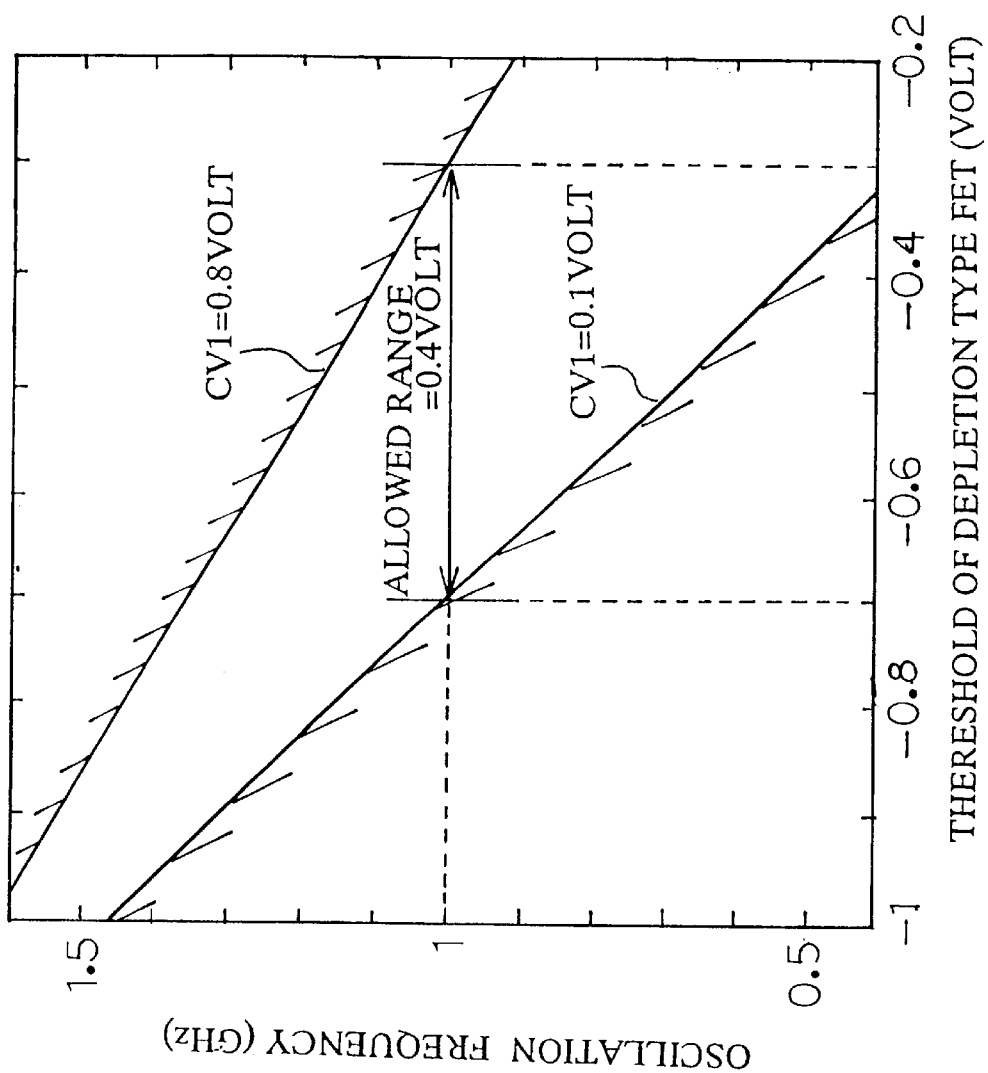
FIG. 2 is a graph showing the relation of the threshold voltage and the oscillation frequency simulated for the prior art voltage controlled oscillator.
Figure 3:
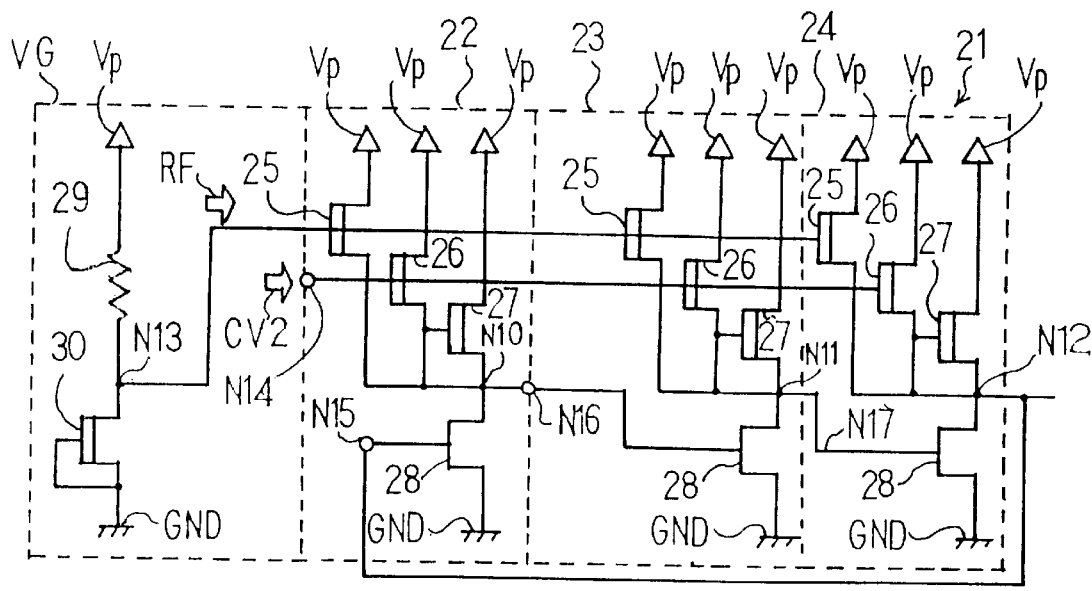
FIG. 3 is a circuit diagram showing a voltage controlled oscillator according to the present invention.

Referring to FIG. 3 of the drawings, a voltage controlled oscillator 21 embodying the present invention comprises three inverters 21, 22 and 23 and a reference voltage generator VG, and the three inverters 21, 22 and 23 form a ring oscillator. The inverters 22, 23 and 24 are similar in circuit configuration to one another, and each inverter 22/23/24 includes three depletion type field effect transistors 25/26/27 connected in parallel between a power voltage source Vp and an output node N10/N11/N12 and an enhancement type field effect transistor 28 connected between the output node N10/N11/N12 and a ground line GND. The reference voltage generator VG is implemented by a series combination of a resistor 29 and a depletion type field effect transistor 30 connected between the power voltage source Vp and the ground line GND. The component transistors 25 to 28 may be a MES (Metal-Semiconductor) field effect transistor with a compound semiconductor channel.

The depletion type field effect transistors 25, 26, 27 and 30 are concurrently fabricated through a process of fabricating the voltage controlled oscillator. For this reason, fluctuation of any process parameter equally affects the transistor characteristics of the depletion type field effect transistors 25 to 27 and 30. The depletion type field effect transistor 30 serves as a load. When the fluctuation increases the current driving capability of the depletion type field effect transistor 30, the resistor 29 decreases the potential level of the reference voltage signal RF. On the other hand, if the fluctuation decreases the current driving capability of the depletion type field effect transistor 30, the resistor 29 increases the potential level of the reference voltage signal RF.

The depletion type field effect transistors 25 have respective gate electrodes connected to an output node N13 of the reference voltage generator VG, and a reference voltage signal RF is supplied to the gate electrodes. The depletion type field effect transistors 25 are responsive to the potential level of the reference voltage signal RF so as to change the current driving capability thereof. If a fluctuation of process parameter increases the threshold of the current driving capability of each depletion type field effect transistor 25/26/27/30, the depletion type field effect transistors 26/27 increases the current driving capability, and increase the amount of load current flowing into the enhancement type field effect transistor 28. The depletion type effect transistor 30 also increases the current passing therethrough, and the resistor 29 widely decreases the potential level of the reference voltage signal RF. As a result, the source-to-gate voltage Vsg of the depletion type field effect transistor 25 becomes small, and the depletion type field effect transistor 25 decreases the amount of current passing therethrough.

Thus, the depletion type field effect transistor 25 cancels the increment of the load current with the decrement of the current passing therethrough, and serves as a compensating transistor. The current passing through the depletion type field effect transistor 26 is corresponding to a third part of driving current.

Each of the depletion type field effect transistors 26 has a gate electrode connected to the control node N14, and varies the amount of current passing therethrough depending upon the potential level of the control voltage signal CV2. The depletion type field effect transistor 26 serves as a control transistor, and the current passing through the depletion type field effect transistor 26 is corresponding to the second part of driving current.

The gate electrode of each of the depletion type field effect transistors 27 is connected to the drain nodes of the enhancement type field effect transistors 28, and supplies constant current to the enhancement type field effect transistor 28. The constant current is corresponding to a first part of driving current. Thus, the total current passing through the depletion type field effect transistors 25/26/27 flows into the enhancement type field effect transistor 28, and is corresponding to a driving current.

The gate electrodes of the enhancement type field effect transistors 28 are respectively connected to input nodes N15, N16 and N17, which in turn are connected to the output nodes N12, N10 and N11, respectively. When the potential level at the input node N15/N16/N17 exceeds the threshold of the enhancement type field effect transistor 28, the enhancement type field effect transistor 28 turns on, and allows the current to flow from the output node N10/N11/N12 to the ground line GND. As a result, the potential level at the output node N10/N11/N12 is lowered. On the other hand, if the potential level at the input node N15/N16/N17 is decayed under the threshold of the enhancement type field effect transistor 28, the enhancement type field effect transistor 28 turns off, and closes the current path from the output node N10/N11/N12 to the ground line GND. As a result, the depletion type field effect transistors 25 to 27 raises the potential level at the output node N10/N11/N12. Thus, the enhancement type field effect transistor 28 serves as a driving transistor.

The enhancement type field effect transistors 28 form a signal propagation path, and the high level and the low level are circulated through the signal propagation path. In other words, the potential level at the output node N10/N11/N12 is swung between the high level and the low level, and an oscillation signal is, by way of example, taken out from the output node N12. The oscillation frequency is varied with the control voltage signal CV2 as similar to the prior art voltage controlled oscillator.

The voltage controlled oscillator is fabricated on a compound semiconductor substrate (not shown). While the manufacturer is fabricating the circuit components 25 to 30 on the compound semiconductor substrate, undesirable turbulence takes place, and process parameters are unintentionally varied from the design value. The process parameters have a serious influence on the threshold of the depletion type field effect transistors 25/26/27/28/30. If the depletion type field effect transistors 26/27 decrease the total current passing therethrough, the reference voltage signal RF causes the depletion type field effect transistor 25 to increase the current, and the increment compensates the decrement of the total current. On the other hand, if the depletion type field effect transistors 26/27 increase the total current, the reference voltage generator VG decreases the potential level of the reference voltage RF, and the depletion type field effect transistor 25 decreases the current passing therethrough. The decrement of the current passing through the transistor 25 cancels the increment of the total current. As described hereinbefore, the propagation delay is dependent on the amount of driving current flowing into the enhancement type field effect transistor. The reference voltage generator VG and the depletion type field effect transistors 25 keep the amount of driving current against the fluctuation of the threshold, and make the voltage controlled oscillator less sensitive to the fluctuation of threshold of the depletion type field effect transistors 26/27.

Figure 4:
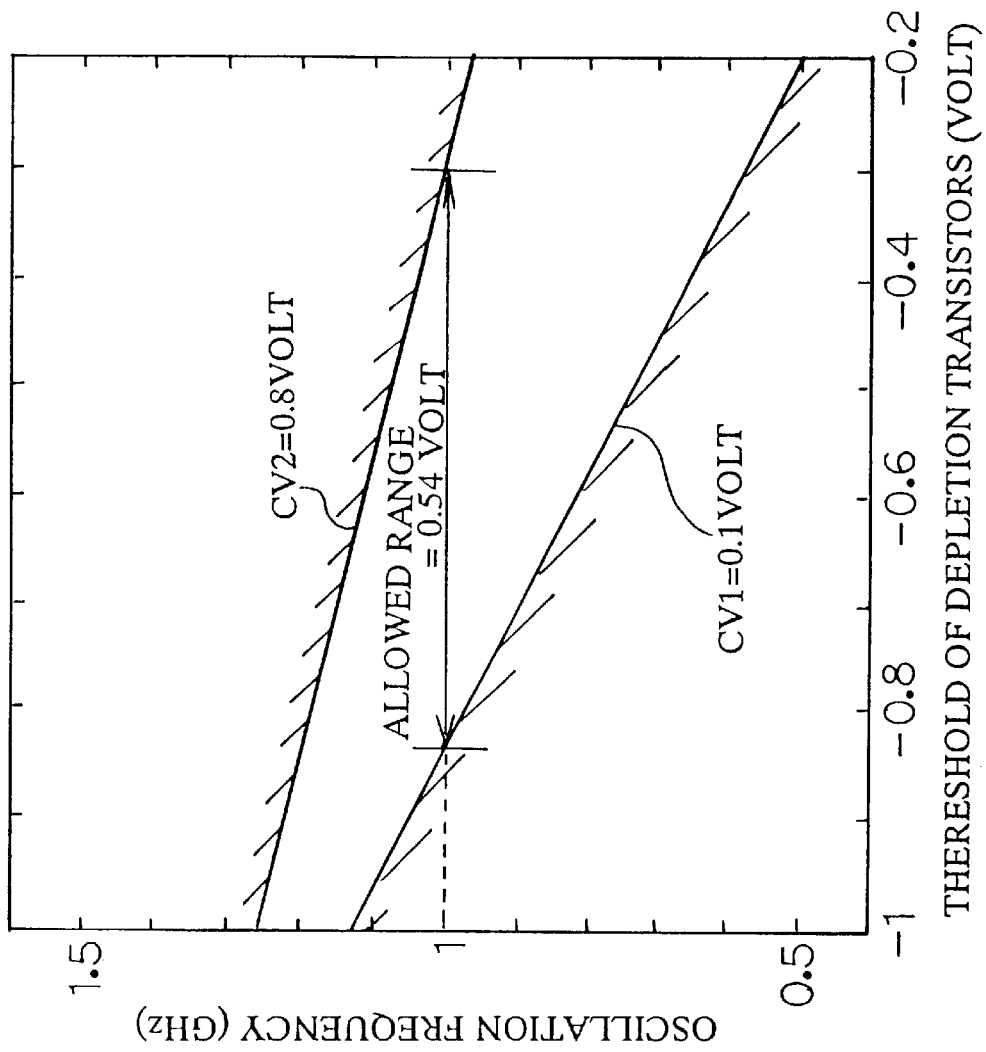
FIG. 4 is a graph showing the relation of a threshold voltage and an oscillation frequency simulated for the voltage controlled oscillator shown in figure 3.

FIG. 4 illustrates a relation between the oscillation frequency and the threshold of the depletion type field effect transistors simulated for the voltage controlled oscillator shown in FIG. 3. However, the voltage controlled oscillator is assumed to have nine inverters powered with 2.0 volts. When the control voltage signal CV2 is changed from 0.1 volt to 0.8 volt, the oscillation frequency is varied together with the threshold as shown. If the voltage controlled oscillator is expected to oscillate at 1 GHz, the depletion type field effect transistors are allowed to have the threshold between –0.84 volt and –0.30 volt. Thus, the threshold range is spread from 0.40 volt to 0.54 volt, and the sensitivity to the threshold is improved at 35 percent.

As will be understood from the foregoing description, the depletion type field effect transistor 25 and the reference voltage generator VG make the voltage controlled oscillator less sensitive to the fluctuation of the threshold, and improve the production yield.

Second Embodiment

Figure 5:
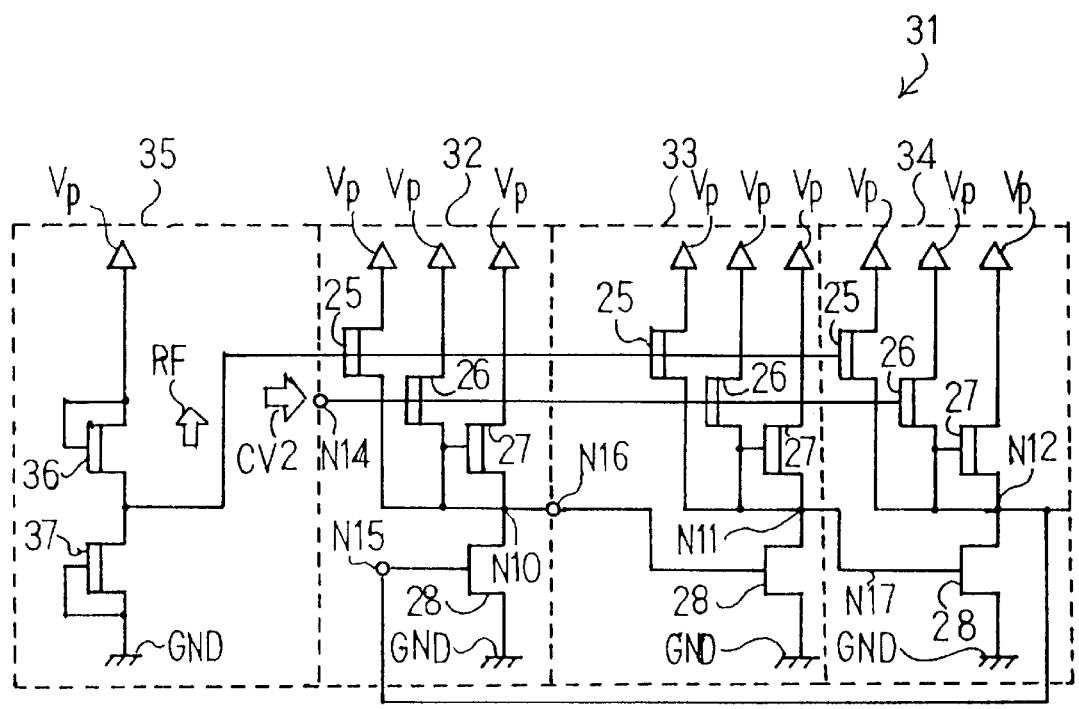
FIG. 5 is a circuit diagram showing another voltage controlled oscillator according to the present invention.

Turning to FIG. 5 of the drawings, another voltage controlled oscillator 31 embodying the present invention largely comprises odd inverters 31, 32 and 33 and a reference voltage generator 35. The inverters 32, 33 and 34 are similar in circuit configuration to the inverter 22/23/24, and the circuit components are labeled with the same references designating corresponding circuit components of the inverter 22/23/24 without detailed description.

The reference voltage generator 35 is implemented by a series combination of depletion type field effect transistors 36 and 37. The series combination is connected between the power voltage source Vp and the ground line GND. The gate electrode of the depletion type field effect transistor 36 is connected to the power voltage source Vp, and the gate electrode of the other depletion type field effect transistor 37 is connected to the ground line GND. The depletion type field effect transistors 37 and 36 serve as another load transistor and yet another load transistor, and are concurrently fabricated together with the depletion type field effect transistors 25 to 27. For this reason, a process for fabricating the voltage controlled oscillator is simpler than that of the first embodiment, because the process does not contain the steps of forming a resistor.

As will be appreciated from the foregoing description, the allowed range for the threshold of the depletion type field effect transistors is wider than that of the prior art voltage controlled oscillator by virtue of the depletion type field effect transistor 25 and the reference voltage generator VG/35.

Although particular embodiments of the present invention have been shown and described, it will be obvious to those skilled in the art that various changes and modifications may be made without departing from the spirit and scope of the present invention.

For example, the operation modes of component transistors of each inverter may be opposite to those of the component transistors 25 to 28, because the given tasks are achievable by the component transistors of the opposite operation modes.

The ring oscillator may be implemented by another kind of logic gates such as NAND gate or NOR gate. If the NAND gates or the NOR gates form the ring oscillator, the ring oscillator may be enabled with a suitable control signal.

The logic gates are never limited to "three". The ring oscillator requires odd logic stages forming a loop.

The component transistors are not limited to the compound semiconductor field effect transistor. They may be a silicon field effect transistor or a bipolar transistor.

What is claimed is:

1. A voltage controlled oscillator comprising odd logic gates forming a signal propagation loop, each of said odd logic gates including
an input node,
an output node connected to the input node of the next logic gate in said signal propagation loop,
a driving transistor responsive to an input potential level at said input node for producing an output potential level opposite to said input potential levels and introducing a piece of time delay variable in dependence on the amount of driving current supplied to,
a load transistor connected to said driving transistor for constantly supplying a first part of said driving current,
a control transistor connected to said driving transistor and responsive to a control voltage signal for supplying a second part of said driving current variable together with the magnitude of said voltage control signal and
a compensating transistor connected to said driving transistor and responsive to a reference voltage signal for supplying a third part of said driving current compensating a difference between the total of said first part and said second part and a design value, and a reference voltage generator producing said reference voltage signal and varying the magnitude of said reference voltage signal inversely to the current driving capability of said load transistor and the current driving capability of said control transistor.

2. The voltage controlled oscillator as set forth in claim 1, in which each of said odd logic gates is implemented by an inverter.

3. The voltage controlled oscillator as set forth in claim 1, in which said driving transistor is operative in an enhancement mode, and said load transistor, said control transistor and said compensating transistor are operative in a depletion mode.

4. The voltage controlled oscillator as set forth in claim 1, in which said reference voltage generator is implemented by a series combination of a resistive element and another load transistor, and a fluctuation during a fabrication process equally affects transistor characteristics of said load transistor, the transistor characteristics of said control transistor and the transistor characteristics of said another load transistor.

5. The voltage controlled oscillator as set forth in claim 4, in which said load transistor, said control transistor, said compensating transistor and said another load transistor are operative in a depletion mode, and said driving transistor is operative in an enhancement mode.

6. The voltage controlled oscillator as set forth in claim 4, in which said resistive element is implemented by a resistor.

7. The voltage controlled oscillator as set forth in claim 4, in which said resistive element is implemented by yet another load transistor.

8. The voltage controlled oscillator as set forth in claim 4, in which said load transistor, said control transistor, said compensating transistor, said another load transistor and said yet another load transistor are operative in a depletion mode, and said driving transistor is operative in an enhancement mode.

* * * * *